US007990288B2

(12) United States Patent
Marchetto

(10) Patent No.: US 7,990,288 B2
(45) Date of Patent: Aug. 2, 2011

(54) REMOTE CONTROL DEVICE

(75) Inventor: Oscar Marchetto, Oderzo (IT)

(73) Assignee: NICE SpA, Oderzo (Treviso) (IT)

( * ) Notice: Subject to any disclaimer, the term of this patent is extended or adjusted under 35 U.S.C. 154(b) by 1079 days.

(21) Appl. No.: 11/764,281

(22) Filed: Jun. 18, 2007

(65) Prior Publication Data

US 2007/0247338 A1 Oct. 25, 2007

(30) Foreign Application Priority Data

Dec. 30, 2004 (IT) .............................. TV2004A0158
Dec. 22, 2005 (WO) ................. PCT/EP2005/057111

(51) Int. Cl.
*H03M 11/00* (2006.01)

(52) U.S. Cl. ............ 341/23; 341/20; 341/176; 400/714; 345/156; 345/173

(58) Field of Classification Search .................... 341/20, 341/23, 176; 345/173, 156; 400/714; 200/5 A
See application file for complete search history.

(56) References Cited

U.S. PATENT DOCUMENTS 5,096,317 A * 3/1992 Phillippe ....................... 400/714
5,729,222 A 3/1998 Iggulden et al.
5,798,715 A * 8/1998 Saperstone ..................... 341/22
6,059,575 A * 5/2000 Murphy ........................ 434/112
6,067,074 A * 5/2000 Lueders ........................ 345/156
6,111,207 A * 8/2000 Arterberry et al. ........... 200/5 R
6,285,299 B1 * 9/2001 King-DeBaun ................. 341/23
6,794,992 B1 9/2004 Rogers
2004/0140998 A1 7/2004 Gravina et al.

FOREIGN PATENT DOCUMENTS

CN 2528055 12/2002
WO 03/007584 1/2003

OTHER PUBLICATIONS

International Search Report dated May 30, 2006.
Chinese Office Action, dated Aug. 1, 2008, for corresponding Chinese Patent Application 200580045643.7.

* cited by examiner

*Primary Examiner* — Albert K Wong
(74) *Attorney, Agent, or Firm* — Katten Muchin Rosenman LLP

(57) ABSTRACT

Remote control device (10) comprising a circuit board (140) with control inputs (46) arranged on one surface thereof (44); control elements (42) which, following an activating action performed by the user, activate one or more inputs (46) from among those present on said board (140), said control elements (42) being incorporated in a selection mask (30; 30*x*; 30*y*) arranged over said inputs (46) for selecting which inputs of the board (140) are activated by an activating action of the user.

7 Claims, 4 Drawing Sheets

REMOTE CONTROL DEVICE

Almost universally nowadays the operating systems for roller blinds (curtains, shutters, etc.) or movable closures (windows, gates, etc.) are equipped with a remote control device, by means of which the user is able to control remotely operation thereof.

Various types of remote control devices exist, but mainly they may be divided up into portable, wall-mounted and centralized remote control devices. The first type has small dimensions such that they may be easily held in one hand and operated with the fingers, the second type is fixed to a wall and have the appearance of an ordinary switch, while the third type is in the form of a unit which is fairly large in size (and therefore not portable), but can be easily positioned anywhere inside a dwelling.

In particular, the electronic circuitry, depending on the type and the functions performed by the remote control device, has a varying architecture. In fact, the functions performed by a remote control device may vary widely: for example operating a shutter or the door of a house, opening car doors or a garage door, operating a curtain or an alarm system, etc. This means that it is required to provide a circuit board for each type of remote control device, in order to incorporate within it all the desired functions.

Universal portable remote control devices are able to operate a set number of objects, defined by the manufacturer. The most common type (for televisions, gates or shutters) are able to operate, however, only a maximum number of 4-6 objects, over and above which a second universal portable remote control device must be used, with consequent increased costs for the user as well as the inconvenience of having a large number of remote control devices.

Generally the remote control devices consist of a circuit board situated inside a casing and underneath push-buttons which are usually incorporated in a keypad (cover). Terminals with contacts for control inputs, usually switches, are provided on the surface of the board. Depending on the type of remote control device to be provided, switches are soldered onto some terminals and will be activated by a user by means of corresponding push-buttons incorporated in the keypad.

This system has certain drawbacks. The arrangement of the control inputs is defined by the type of remote control device which the board will form and therefore several boards with varying arrangements of inputs are required. Moreover, the keypad must also be adapted to the board—and to its inputs—with the result that it is required to produce a different keypad and board for each type of remote control device.

Obviously a large number of terminals and push-buttons means a greater complexity and a higher production cost for the remote control device. Furthermore, each remote control device is designed to be used for the whole of its working life and therefore it is not envisaged being able to modify it during use.

In view of the different characteristics of the various types of remote control devices and the difficulty of standardizing the components of remote control devices, the manufacturers are obliged to produce various groups of remote control devices, with high costs and management problems.

Clearly it would be useful to have a solution which could ensure efficient production of a group of remote control devices, for example of the type mentioned above, without the limitations and the drawbacks described.

The main object of the present invention is to provide remote control devices which do not have the drawbacks of the present state of the art.

These and other objects are achieved with a remote control device in accordance with the claims below, namely a remote control device comprising a circuit board with control inputs arranged on one surface thereof; control elements which, following an activating action performed by the user, activate one or more inputs from among those present on said board, characterized in that said control elements are incorporated in a selection mask arranged over said inputs for selecting which inputs of the board are activated by an activating action of the user.

A fundamental characteristic feature of the invention is therefore that of affixing a (removable or non-removable) mask on the control inputs present on an electronic circuit board which performs the functions of a remote control device. A user may operate control elements of this mask, advantageously by pressing push-buttons or activation surfaces or by operating levers. By means of the mask, it is possible to direct the user's action, which is performed via the control elements of the mask, to any desired input of the board. In this way, it is possible to maintain, in each remote control device, the same circuit board and vary the mask as required, depending on the application. Clearly, each application will require precise functions for the remote control device. These functions are activated on the circuit board by means of activation of certain of its control inputs, which are in turn activated by the user via the mask. The user will have available—for example—a keypad always with three identical push-buttons, but, depending on the remote control device being used, the three push-buttons will activate different inputs of the board, therefore activating different functions. For the user—and this is an advantage of the invention—it is possible to operate remote control devices with different functions, but identical in appearance, obviously facilitating use.

The mask may comprise suitable activators between a generic activation surface for the user push-buttons or levers, etc) and one or more inputs of the board.

By suitably configuring the activators between the operating surface and one or more inputs of the board it is possible to choose which of the inputs is activated with pressing of the operating surface (or also, for example, by operation of the levers).

The advantages of the invention will become clearer from the following description, provided by way of an example, of an embodiment of the invention. This description will refer to the accompanying drawings in which.

Figure 1:
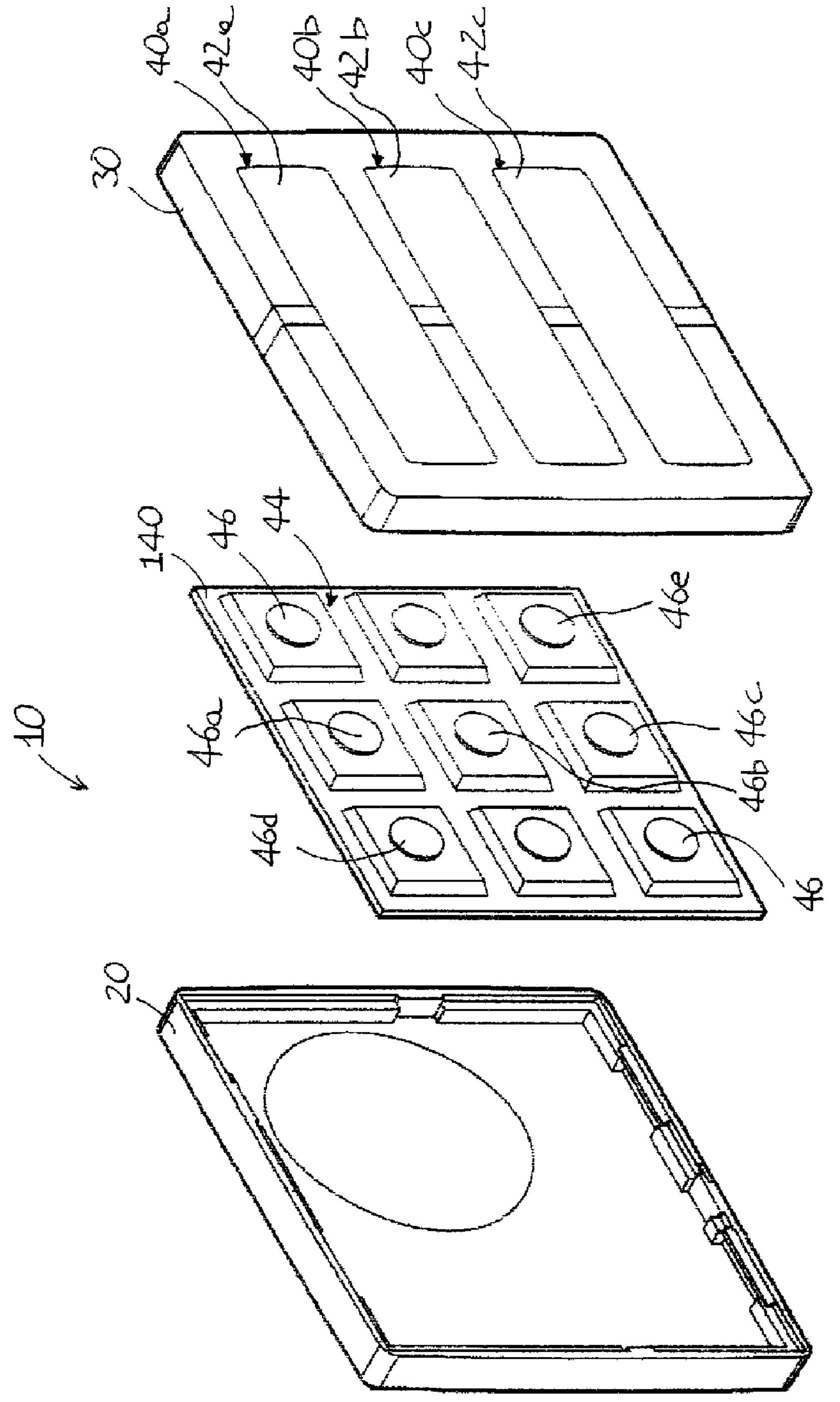
FIG. 1 shows a three-dimensional exploded view of the remote control device according to the invention.

In FIG. 1, number 10 denotes a remote control device according to the invention. It comprises a base 20 containing a board 40 over which a keypad 30 is arranged and snap-engaged, said keypad acting as a cover and incorporating controls by means of which a user can act on the board 40.

The board 140—which is designed in a known manner—has on a surface 44 thereof control inputs 46 which in this example consist of nine surface switches of the known type arranged uniformly in three rows. The pressing of any one of these switches causes the generation, on the circuit board 140, of a control signal. Some inputs 46 are distinguished by a suffix (a, b, c, d, e) for the reasons explained below.

The keypad 30 comprises—see FIG. 1—on its larger surface 32 three windows 40*a*, 40*b*, 40*c*, each of which is closed by a corresponding pad 42*a*, 42*b*, 42*c* of soft and elastic plastic which defines an operating surface for a user (equivalent to a push-button). The user by means of pressure on the operating surface accesses and controls the functions of the remote control device 10. In the rest condition, the pads 42*a*, 42*b*, 42*c* are flat and coplanar with the keypad 30, whereas, when pressed, they are deformed and move towards the underlying board 140.

Activators are present on a surface of the pads 42*a*, 42*b*, 42*c* —i.e. the surface facing the board 40 (see FIG. 2)—and activate, by means of contact, inputs 46 underlying the said pads 42*a*, 42*b*, 42*c*. Said activators comprise a plastic base 52 from which a head 50 integral therewith and perpendicular to the corresponding pad 42 extends, said head 50 having a length slightly less than the distance between the surface 32 and the control inputs 46. This ensures that when the pads 42*a, b, c* are not pressed, the heads 50*a*, 50*b*, 50*c* do not make contact with the inputs 46. In the figures, a suffix "a", "b" ad "c" has been added to the reference numbers 50 which denote said heads in order to indicate which of the corresponding inputs 46*a*, 46*b*, 46*c* (see FIG. 1) each head activates in the remote control device 10, once the base 20 and the keypad 30 are arranged on top of each other.

Figure 2:
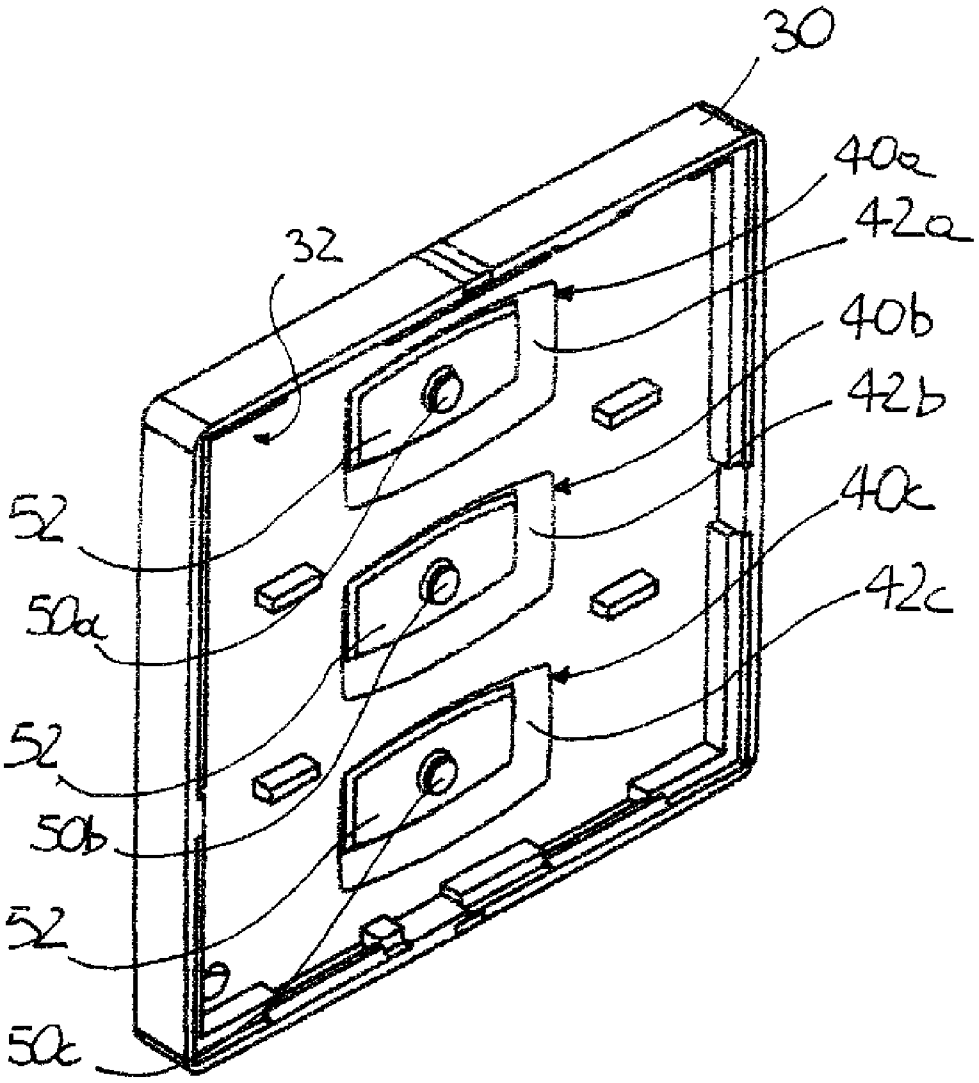
FIG. 2 shows a three-dimensional rear view of a keypad of the remote control device according to FIG. 1.

Following pressing of a pad 42, the corresponding head 50 moves towards the board 140 and presses one of the switches 46, activating control signals on the board 140 (in the example of FIG. 2 it is possible to activate the central column of switches 46*a*, 46*b* and 46*c*).

Figure 3:
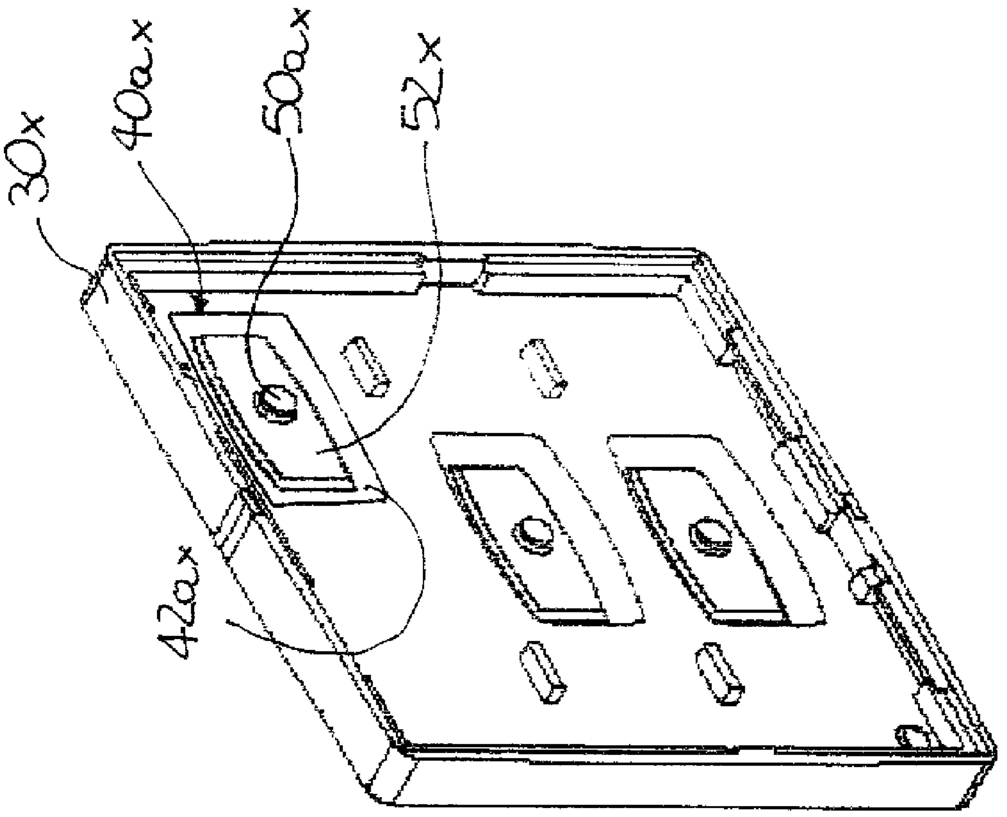
FIG. 3 shows a three-dimensional rear view of a variant of the keypad according to FIG. 2.

The characteristic feature of the invention is that it allows the activation also of inputs different from those shown while maintaining the same structure of the keypad and pads 42*a*, 42*b*, 42*c*. It is sufficient to vary the position of the windows 40 and the activators described. By way of example reference may be made to FIG. 3 where identical reference numbers indicate parts which are constructionally identical to the previous parts, this variant being distinguished by means of a suffix "x". It is assumed that the keypad 30*x* is in the same position on the board 140 as in the previous example. The upper window 40*a* in FIG. 2—considering the orientation shown in the figures—has been widened horizontally and moved to the right; the same applies to the control elements (see reference numbers 40*ax*, 52*x* and 50*ax*). Now pressing the upper pad 42*ax* in the keypad 30 causes the head 50*ax* to reach and activate the input 46*d* (see FIG. 2) namely the input to the left of the input 46*a* on the board 40.

It should be noted that the board 140 is always the same (for this reason the same reference number is maintained), as is the structure of the keypad 30 and 30*x* (in particular the form of the pads 42*a*, 42*b* and 42*c*). In the case of the latter only the position of the upper window 40*ax* and the activators 52*x* and 50*x* has changed.

In view of the square shape of the keypad 30 and the board 40, it is also possible to vary their relative arrangement and activate other inputs (in this second embodiment, for example, by rotating the keypad 30*x* with respect to the board 140 through 180°, the inputs 46*a*, 46*b* and 46*e* are activated).

From the examples it can be understood how the invention allows one in a simple manner to choose which, among the inputs of the circuit board, are activated by the user. The board, which keeps the inputs 46 in a predefined position, may be programmed once only, providing all the functions of a group of remote control devices. The arrangement of the activators on the pads 42 may define which inputs they activate once the user operates said pads 42. Depending on the inputs activated, the corresponding programmed functions will then be activated, without having to provide a separate board—and hence remote control device—for each set of functions.

Figure 4:
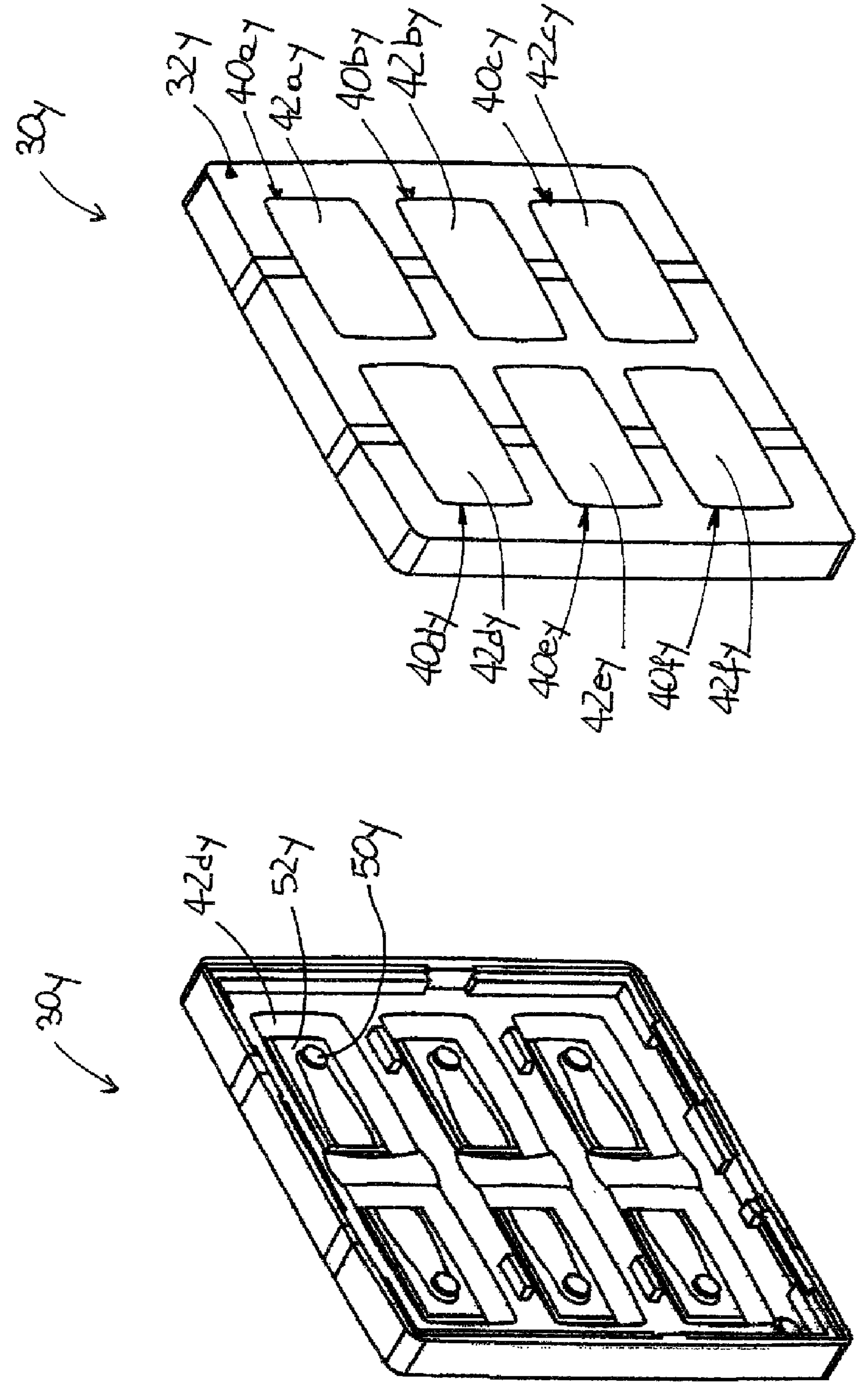
FIG. 4 shows a three-dimensional rear view (left) and front view (right) of a variant of the keypad according to FIG. 2.

FIG. 4 shows a further variant of the keypad according to FIG. 2, denoted by 30*y*. Identical reference number indicate parts which are constructionally identical to the previous parts, this variant being distinguished by means of a suffix "y". Essentially in this variant the keypad 30*y* comprises on its larger surface 32*y* six windows 40*ay*, 40*by*, 40*cy*, 40*dy*, 40*ey*, 40*fy*, each of which is closed by a corresponding pad 42*ay*, 42*by*, 42*cy*, 42*dy*, 42*ey*, 42*fy* of soft and elastic plastic. As in the previous variants, each pad comprises as activators a plastic base 52*y* from which a head 50*y* integral therewith and perpendicular to the corresponding pad (only some are shown in FIG. 4) projects. Operation of this keypad 30*y* is the same as for the previous variants, the only change being the switches which it activates.

Since the keypads 30 are designed to be interchangeable on the board 140 so that, when replaced, a different remote control device is provided, it is required to inform the board 140 which type of keypad is being used. One procedure could comprise the following steps:

a) Affix onto the board 140 the keypad 30 for the desired model of remote control device.

b) Power up the board and press and release a key a number of times corresponding to the desired model of remote control device. This number is coded by the manufacturers. During this step the circuit board is instructed as to which keypad is mounted on it.

c) Wait, without pressing any keys, for the board to confirm the acquisition of the data and its correct operation (by means of acoustic or visual signals, for example with LEDs or displays).

Therefore, a method for recognizing a mask on a remote control device according to the invention may comprise the steps of:

- immediately after initializing the board, checking the status of the control inputs of the board and determining the number of times an input is activated;
- selecting a control program inside the board depending on said number, said program providing the function of a particular remote control device;
- confirming acquisition of the data and correct operation of the board with the selected program by means of acoustic or visual signals.

The invention may be subject to many variants. The control inputs may also be ordinary printed circuit tracks interrupted over a short section and the control elements may comprise a conductive element—for example situated at the end of the heads 50—which, when a pad 42 is pressed, reaches and connects the two track sections, closing a circuit.

The pads 42 may also be replaced by ordinary push-buttons, the movable body of which activates the inputs of the board 40. Both with the pads 42 and with a push-button design, a further advantage of the invention is the possibility of activating simultaneously several inputs (it would be sufficient, for example, to provide on the base 52 of a pad 42 two or more heads 50 for activating several inputs). This has the advantage that the logic of the circuit board may recognize a greater number of combinations of input signals and activate a greater number of corresponding functions. The inputs to be activated must not necessarily be situated underneath the pads 42 (or push-buttons), it being possible to provide, for example, projections which are not perpendicular to the base 52 and which reach any input 46 of the board 40.

The remote control device according to the invention clearly may be used in all those applications where remote operation is required.

All these variant are included within the scope of protection of the following claims.

The invention claimed is:

1. A remote control device (10), comprising:

a circuit board (140) with control inputs (46) arranged on one surface thereof (44) in a matrix configuration;

a base containing the circuit board;

control elements (42) which, following an activating action performed by a user, activate one control input (46) of the control inputs on the circuit board (140), and are incorporated in a selection mask (30, 30*x*, 30*y*) arranged over the control inputs (46) for selecting which control inputs of the circuit board (140) are activated by an activating action of the user, wherein the selection mask is a keypad (30) acting as a cover on the base and including:

windows (40*a*, 40*b*, 40*c*) each closed by a pad (42*a*, 42*b*, 42*c*) which defines an operating surface for the user, and one projecting activator on an internal surface (32) of each pad (42*a*, 42*b*, 42*c*) for activating a control input on the circuit board when the pad is pressed by the user; and wherein the circuit board and the control inputs provide functions of a group of remote control devices and more than one interchangeable keypad is provided, each keypad being associated to the functions of a remote control device of the group of remote control devices; whereby when one selection mask is applied on the base, the associated remote control device of the group is formed.

2. The remote control device (10) according to claim 1, in which the pad (42*a*, 42*b*, 42*c*) is of a flexible material and, in the rest condition, is flat and coplanar with the keypad (30), whereas when pressed is deformed and move towards the underlying board (140); the projecting activator presents on the internal surface (32) of the pad (42*a*, 42*b*, 42*c*) having a length less than the distance between the internal surface (32) and the control inputs (46), and the window having an extension encompassing one input, so that the user's action is directed to said one input by suitably arranging the position of the activator on its pad.

3. The remote control device (10) according to claim 1, in which the activator (50, 52) is in the form of a plastic base (52) from which a head (50) integral therewith and perpendicular to the corresponding pad extends.

4. The remote control device (10) according to claim 3, in which the head (50) is located near the right or left side of the plastic base.

5. The remote control device (10) according to claim 4, in which the board (140) and the mask (30; 30*x*;30*y*) have a square shape in plan view.

6. The remote control device (10) according to claim 5, in which the mask (30; 30*x*; 30*y*) is removable from the board (140).

7. A method for use in a remote control device (10), the remote control device (10) comprising:

a circuit board (140) with control inputs (46) arranged on one surface thereof (44) in a matrix configuration;

a base containing the circuit board;

control elements (42) which, following an activating action performed by a user, activate one control input (46) of the control inputs on the circuit board (140), and are incorporated in a selection mask (30, 30*x*, 30*y*) arranged over the control inputs (46) for selecting which control inputs of the circuit board (140) are activated by an activating action of the user, wherein the selection mask is a keypad (30) acting as a cover on the base and including:

windows (40*a*, 40*b*, 40*c*) each closed by a pad (42*a*, 42*b*, 42*c*) which defines an operating surface for the user, and one projecting activator on an internal surface (32) of each pad (42*a*, 42*b*, 42*c*) for activating a control input on the circuit board when the pad is pressed by the user; and wherein the circuit board and the control inputs provide functions of a group of remote control devices and more than one interchangeable keypad is provided, each keypad being associated to the functions of a remote control device of the group of remote control devices; whereby when one selection mask is applied on the base, the associated remote control device of the group is formed, the method recognizes which keypad (30) is arranged over the control inputs as a cover and activates the functions in the circuit board associated to the keypad and remote control device of the group, the method comprising the steps of:

checking a status of the control inputs (46) of the circuit board (140) immediately after initializing the circuit board (140) and determining a number of times a control input is activated;

selecting a control program inside the circuit board (140) depending on the number, the control program providing the functions of the associated remote control device of the group; and confirming acquisition of data and correct operation of the circuit board (140) with the selected program by means of acoustic or visual signals.

* * * * *

UNITED STATES PATENT AND TRADEMARK OFFICE

CERTIFICATE OF CORRECTION

PATENT NO. : 7,990,288 B2
APPLICATION NO. : 11/764281
DATED : August 2, 2011
INVENTOR(S) : Oscar Marchetto It is certified that error appears in the above-identified patent and that said Letters Patent is hereby corrected as shown below:

On the Title Page:

Add

Item -- (63) Related U.S. Application Data

Continuation of application No. PCT/EP2005/057111, filed on Dec. 22, 2005. --

On the Title Page, item (30) should read as follows:

Item -- (30) Foreign Application Priority Data

Dec. 30, 2004 (IT) ...........................TV2004A000158 --

Signed and Sealed this
Twenty-second Day of November, 2011

David J. Kappos
*Director of the United States Patent and Trademark Office*